(12) United States Patent
Parkin

(10) Patent No.: US 7,534,626 B2
(45) Date of Patent: *May 19, 2009

(54) MGO-BASED TUNNEL SPIN INJECTORS

(75) Inventor: Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 111 days.

This patent is subject to a terminal disclaimer.

(21) Appl. No.: 11/835,037

(22) Filed: Aug. 7, 2007

(65) Prior Publication Data

US 2008/0145952 A1    Jun. 19, 2008

Related U.S. Application Data

(63) Continuation of application No. 10/969,735, filed on Oct. 19, 2004, now Pat. No. 7,274,080, which is a continuation-in-part of application No. 10/646,247, filed on Aug. 22, 2003, now abandoned.

(51) Int. Cl.
*H01L 21/00* (2006.01)
*H01L 29/82* (2006.01)
(52) U.S. Cl. .................... 438/3; 257/E21.665; 977/933
(58) Field of Classification Search ................ 257/30, 257/421, 427, E43.001, E29.323, E27.006, 257/E21.665; 365/129; 438/3, 29, 57; 977/932–935
See application file for complete search history.

(56) References Cited

U.S. PATENT DOCUMENTS 7,274,080 B1 *    9/2007    Parkin ................... 257/421

OTHER PUBLICATIONS

Bruley, J., et al. "Nanostructure and Chemistry fo a (100)MgO/(100)GaAs Interface." Appl. Phys. Lett., vol. 65, No. 5 (Aug. 1, 1994): pp. 564-566.*

Jansen, R. "The Spin-Valve Transistor: A Review and Outlook." J. Phys. D: Appl. Phys., vol. 36 (2003): pp. R289-R308.*

Manago, T. and Akinaga, H. "Spin-Polarized Light-Emitting Diode Using Metal/Insulator/Semiconductor Structures." Appl. Phys. Lett., vol. 81, No. 4 (Jul. 22, 2002): pp. 694-696.*

Motsnyi, V.F., et al. "Electrical Spin Injection In a Ferromagnet/Tunnel Barrier/Semiconductor Heterostructure." Appl. Phys. Lett., vol. 81, No. 2 (Jul. 8, 2002): pp. 265-267.*

* cited by examiner

*Primary Examiner*—Douglas M Menz
*Assistant Examiner*—Matthew W Such
(74) *Attorney, Agent, or Firm*—Daniel E. Johnson

(57) ABSTRACT

A MgO tunnel barrier is sandwiched between semiconductor material on one side and a ferri- and/or ferromagnetic material on the other side to form a spintronic element. The semiconductor material may include GaAs, for example. The spintronic element may be used as a spin injection device by injecting charge carriers from the magnetic material into the MgO tunnel barrier and then into the semiconductor. Similarly, the spintronic element may be used as a detector or analyzer of spin-polarized charge carriers by flowing charge carriers from the surface of the semiconducting layer through the MgO tunnel barrier and into the (ferri- or ferro-) magnetic material, which then acts as a detector. The MgO tunnel barrier is preferably formed by forming a Mg layer on an underlayer (e.g., a ferromagnetic layer), and then directing additional Mg, in the presence of oxygen, towards the underlayer.

25 Claims, 10 Drawing Sheets

MGO-BASED TUNNEL SPIN INJECTORS

This application is a continuation of, and claims priority to, Applicant's copending application Ser. No. 10/969,735 filed Oct. 19, 2004 and entitled "MgO-Based Tunnel Spin Injectors", which in turn is a continuation-in-part of, and claims priority to, Applicant's copending application Ser. No. 10/646,247 filed Aug. 22, 2003 and entitled "MgO-Based Tunnel Spin Injectors" (now abandoned), both of which are hereby incorporated by reference.

The U.S. Government has a paid-up license in this invention and the right in limited circumstances to require the patent owner to license others on reasonable terms as provided for by the terms of contract MDA972-01-C-0051 awarded by DARPA.

TECHNICAL FIELD

This invention relates to tunnel junction injectors and detectors of spin-polarized electrons for use in semiconductor spintronic devices. More particularly, this invention relates to a tunnel injector with high spin polarization formed from a ferromagnetic layer in conjunction with a MgO tunnel barrier on a semiconductor.

BACKGROUND OF THE INVENTION

The development of modern semiconductor electronics has followed Moore's law [G. E. Moore, Electronics 38, 114 (1965)] for several decades, with the integration density doubling approximately every two years to give rise to ever more powerful and yet cheaper logic and memory devices. However, as the device minimum feature size shrinks towards fundamental physical limits, which will eventually preclude or slow down scaling to even smaller sizes, there are increasing efforts to search for alternatives to conventional electronic devices. In particular, conventional microelectronic devices use the electron's charge or the flow of electron charge to build useful memory and logic devices. The electron has another fundamental property, its spin, which is a quantum mechanical property that gives rise to magnetism. The spin of an electron has two flavors and is characterized as either being up or down. Electron spin-based microelectronics, or what is often referred to as spintronics, is emerging as a promising technology to rival or replace charge-based electronics. In contrast to conventional electronics, where the electron charge in semiconducting materials is used for device operations, spintronics attempts to harness the electron's spin to process and store information. It is widely believed that spintronics has the potential to bring about a new generation of electronic devices with high speed and density, non-volatility and low power consumption [S. A. Wolf et al., Science 294, 1488 (2001)].

Spintronics takes advantage of the long relaxation time (>100 ns) [J. M. Kikkawa and D. D. Awschalom, Physical Review Letters 80, 4313 (1998)] and large coherence length (>100 μm) [J. M. Kikkawa and D. D. Awschalom, Nature 397, 139 (1999)] of electron spins within semiconducting materials. However, a major obstacle for semiconductor spintronics is the electrical generation of highly spin-polarized carriers within semiconductors, which is often referred to as spin injection. Once spin-polarized electrons or holes (vacancies of electrons in the valence band) are injected they can then be subjected to further spin manipulation and spin detection to create devices with new functionality. In III-V bulk semiconductors such as GaAs, the hole spin relaxation is much faster than the electron spin relaxation due to the strong spin-orbit interaction within the valence sub-bands. Consequently, the hole spin relaxation time is on the scale of the momentum relaxation time (~100 fs), whereas the electron spin relaxation time can be much longer than the momentum relaxation time. In GaAs based quantum well structures, however, the splitting of the valence sub-bands results in a significant enhancement of the hole spin relaxation time. Hole relaxation times as long as 1 ns have been observed by Roussignol et al. in an n-modulation doped 7.5 nm thick GaAs/Al$_x$Ga$_{1-x}$As quantum well [Physical Review B 46, 7292 (1992)]. It is anticipated that electron spin relaxation times should be even longer in doped silicon semiconducting materials because of weaker spin-orbit coupling.

Various methods have been adopted to inject electron and hole spins into semiconductors. The very first approaches simply attached ferromagnetic metal contacts to the surfaces of semiconductors and passed electrical current from the metal contact into the semiconductor. Since it is well known that electrical current in ferromagnetic metals is usually dominated by either the spin-up or spin-down electrons, it was supposed that one could use such contacts to directly inject spin-polarized current into semiconductors. However, despite considerable effort over many years the efficiency of spin injection from ferromagnetic metals into semiconductors through diffusive contacts has been determined experimentally to be very low [see, for example, Filip et al., Physical Review B 62, 9996 (2000)]. While for a long time this was regarded as a problem of spin relaxation within the ferromagnet/semiconductor contact region, perhaps due to the poor structural integrity of such contacts, it is now believed that the injection efficiency is fundamentally limited by the mismatch in conductivity between typical ferromagnetic metals and semiconductors [Schmidt et al., Physical Review B 62, R4790 (2000)].

One potential way around the conductivity-mismatch problem is to use ferromagnetic contacts with lower electrical conductivities, such as magnetic semiconductors. In 1999, two groups demonstrated spin injection from two different dilute magnetic semiconducting materials into GaAs based semiconducting heterostructures. Both groups used GaAs-based quantum well (QW) light emitting diode (LED) structures to measure the spin polarization of the injected electrical current. Injected electrons (holes) are combined with holes (electrons) within the QW LED to emit photons. The circular polarization of emitted light is indicative of the spin-polarization of the injected electrons or holes. Fiederling et al. [Nature 402, 787 (1999)] used a Mn and Be doped ZnSe alloy, BeMnZnSe, as a spin-injector for n-doped AlGaAs. BeMn-ZnSe is paramagnetic but has a very large g-factor, so that by applying large magnetic fields (several Tesla) the electronic levels are Zeeman split such that the lowest energy conduction band states become spin-polarized. Fiederling et al. showed a significant degree of spin polarization of the injected electrons but only at very low temperatures (well below 30K) and in large magnetic fields. Ohno et al. [Nature 402, 790 (1999)] used Mn doped GaAs (GaMnAs) for spin injection into undoped GaAs but only found evidence for very low spin polarization of the injected holes. GaMnAs is believed to be ferromagnetic for low concentrations of Mn dopants but only at low temperatures. The Curie temperature of GaMnAs is below ~150K. Thus, neither of these dilute magnetic semiconductor spin injectors is useful for practical devices since they only operate at low temperatures.

Theoretical work by Rashba [Physical Review B 62, R16267 (2000)] proposed that the presence of a tunnel barrier between ferromagnetic metals and semiconductors could overcome the conductivity mismatch problem, potentially allowing ferromagnetic metals to be used as spin injectors. Ferromagnetic metals are known to have Curie temperatures much higher than room temperature, making them useful for device applications. Hanbicki et al. [Applied Physics Letters 82, 4092 (2003)] utilized an Fe/GaAs Schottky tunnel barrier to realize spin injection. A Schottky tunnel barrier is typically formed when a metal is placed on a semiconductor, and is due to electronic energy band-bending in the semiconductor and the formation of a depletion region in the surface region of the semiconductor. The extent of the depletion region is largely governed by the concentration of charge carriers in this region, which itself is determined by the dopant concentration of the semiconductor. As shown in FIG. 1A, Hanbicki et al. deposited a 10 nm thick Fe layer 32 on an AlGaAs/GaAs quantum well LED structure 11 by molecular beam epitaxy (MBE). Electrons were injected from the Fe layer 32 into the quantum well LED 11 by applying a bias voltage 42 across the entire structure in a perpendicular magnetic field oriented in the direction given by arrow 52, which aligned the magnetic moment in the ferromagnetic Fe layer 32 to be perpendicular to the film plane (i.e., the plane defined by the interface of the LED structure 11 and the Fe layer 32). The injected electrons recombined with holes in the quantum well LED 11 and emitted light 62. According to the optical selection rules [see, for example, "*Optical Orientation*", NorthHolland, Amsterdam, 1984, edited by Meier and Zakharchenya], the circular polarization of the light 62 in this geometry is correlated with the spin-polarization of the injected electrons and, therefore, can be used to determine the spin injection efficiency. Hanbicki et al. measured a spin polarization of 32% at 4.5 K using this optical detection technique. The measured spin polarization, however, decreased rapidly at higher temperatures. Furthermore, to grow the Fe layer 32 with MBE is impractical for device fabrication. The direct contact of the Fe layer 32 with the semiconductor LED 11 could cause intermixing between the two and thus compromise the device thermal stability.

As shown in FIG. 1B, Manago and Akinaga [Applied Physics Letters 81, 694 (2002)] used a 2 nm thick $Al_2O_3$ tunnel barrier 24' grown on an AlGaAs/GaAs quantum well LED 11' for spin injection. A ferromagnetic electrode 32', consisting of Co, Fe or $Ni_{80}Fe_{20}$, was deposited on top of the $Al_2O_3$ tunnel barrier 24' and capped with a Au layer 34'. Electrons were injected from the ferromagnetic layer 32' into the quantum well LED 11' by applying a bias voltage 42' across the entire structure in a perpendicular magnetic field whose orientation is given by arrow 52', with this magnetic field aligning the magnetic moment in the ferromagnetic layer 32' to be perpendicular to the film plane. The injected electrons recombined with holes in the quantum well LED 11' and emitted light 62', whose circular polarization was used to analyze the injected electron spin polarization. Manago and Akinaga only observed a small polarization of ~1% at room temperature. As shown in FIG. 1C, Motsnyi et al. [Applied Physics Letters 81, 265 (2002)] formed an $Al_2O_3$ tunnel barrier 24'' by oxidizing a 1.4 nm thick Al layer grown on an AlGaAs/GaAs layered structure 12'' for spin injection. A ferromagnetic electrode 32'', consisting of 2 nm $Co_{90}Fe_{10}$ followed by 8 nm $Ni_{80}Fe_{20}$, was deposited on top of the $Al_2O_3$ tunnel barrier 24'' and capped with 5 nm Cu 34''. Electrons were injected from the ferromagnetic layer 32'' into the semiconductor structure 12'' by applying a bias voltage 42'' across the entire structure in an oblique magnetic field whose orientation is given by the arrow 52''. The injected electrons recombined with holes in the semiconductor structure 12'' and emitted light 62''. In this geometry, the circular polarization of the light does not directly reflect the injected electron spin polarization. Motsnyi et al. used the Hanle effect to deduce the spin injection efficiency ["*Optical Orientation*", NorthHolland, Amsterdam, 1984, edited by Meier and Zakharchenya]. The directly measured light polarization was only a few percent at 80 K, and the interpretation of the data could be further complicated by other parasitic effects.

Thus none of these prior art spin injectors give significant spin-polarized electrons at room temperature. What is needed for semiconductor spintronic devices is a source of highly spin-polarized electrons operating at room temperature and prepared using practical fabrication techniques.

SUMMARY OF THE INVENTION

The present invention provides a MgO based tunnel spin injector as a source of highly spin-polarized electrons at useful temperatures for semiconductor spintronic applications. The spin injector includes a ferromagnetic metal electrode and a MgO tunnel barrier grown on a semiconductor. By applying a bias voltage across the entire structure, spin-polarized electrons can be transported into the semiconductor for further spin manipulation and detection. The spin injector of the present invention has many advantages over prior art spin injectors including the high spin polarization of the injected electrons at room temperature and good thermal stability. A lower bound for spin injection efficiency of ~50% is observed at 100 K, which is expected to remain high up to room temperature due to the high Curie temperatures of the ferromagnetic metals and the weak temperature dependence of the tunneling process.

The present invention also provides a method of forming a MgO based tunnel spin injector. The MgO tunnel barrier is grown on a semiconductor by first depositing a thin metallic Mg layer followed by a MgO layer fabricated by depositing Mg in the presence of reactive oxygen.

The present invention also provides a method of improving the spin injection efficiency by thermal annealing. The thermal annealing, in addition, provides evidence that good thermal stability is achieved in the present invention.

The ferromagnetic layers disclosed herein can be formed from any ferromagnetic or ferrimagnetic metal or indeed any ferromagnetic or ferrimagnetic material which is sufficiently conducting. In particular, these layers can be formed from ferrimagnetic metals such as $Fe_3O_4$, or from metallic ferromagnetic oxides such as oxides from the perovskite family, including the family of ferromagnetic manganites such as $La_{1-x}Sr_xMnO_3$. Likewise, these layers can also be formed from various half-metallic ferromagnetic metals including $CrO_2$, the half-Heusler alloys such as NiMnSb and PtMnSb and other ferromagnetic Heusler and half-Heusler alloys.

One embodiment of the invention is a device that comprises a first layer that includes at least one magnetic material from the group consisting of ferromagnetic materials and ferrimagnetic materials. The device also comprises a MgO tunnel barrier on and in contact with the first layer, and a second layer that includes semiconductor material. The second layer is on and in contact with the MgO tunnel barrier, so that the MgO tunnel barrier is sandwiched between the first layer and the second layer, thereby forming a first spintronic element. The first layer, the MgO tunnel barrier, and the second layer are configured to enable spin-polarized charge carrier transport between the semiconductor and the magnetic material, so that spin-polarized charge carriers can flow into and/or out of the semiconductor (e.g., electrons may be injected into the semiconductor). In one embodiment, at least one of the first layer and the second layer includes a spacer layer that is in contact with the MgO tunnel barrier, in which the spacer layer does not substantially interfere with the tunneling properties of the MgO tunnel barrier, thereby allowing charge carriers to substantially maintain their spin polarization as they pass through the spintronic element. Alternatively, the MgO tunnel barrier may be in direct contact with both the semiconductor and the magnetic material. The first layer may include a ferromagnetic material, such as Fe, or an alloy of Co and Fe, in which the Fe concentration is between 8 and 50 atomic %, or more preferably between 12 and 25 atomic %. Alternatively, the ferromagnetic material may be an alloy of at least 2 metals selected from the group consisting of Ni, Fe, and Co, and the ferromagnetic material may advantageously be bcc and substantially (100) oriented. The device may further comprise a layer of antiferromagnetic material, with the ferromagnetic material being exchange biased by the antiferromagnetic material, and this antiferromagnetic material may include an alloy selected from the group consisting of Ir—Mn and Pt—Mn. In one embodiment, the layer of ferromagnetic material may have a shape that is generally longer in one direction than in another direction, thereby fixing the magnetic moment of the ferromagnetic material through shape magnetic anisotropy. The device may further comprise a first lead that is in electrical communication with the semiconductor material, as well as a second lead that is in electrical communication with the ferromagnetic material, with these leads providing voltage across the spintronic element to enable the flowing of spin-polarized charge carriers into and/or out of the spintronic element. The device may include antiferromagnetic material that is in electrical communication with both the ferromagnetic material and the second lead. The semiconductor may advantageously be GaAs; alternatively, the semiconductor may be selected from the group consisting of $Al_xGa_{1-x}As$, $In_yGa_{1-y}As$, ZnSe, GaN, InGaN, GaNInAs, GaSb, InGaSb, InP, InGaP, Si, Ge, SiGe, and heterostructures thereof, in which x and y are between 0 and 100%. The MgO tunnel barrier may be substantially (100) oriented; preferably both the MgO tunnel barrier and the ferromagnetic material are substantially (100) oriented, and the ferromagnetic material is bcc. The MgO tunnel barrier may advantageously have a thickness between 3 and 50 angstroms. In a preferred embodiment, the first layer, the MgO tunnel barrier, and the second layer are configured so that, upon application of a voltage across the device, the spin polarization of current between the MgO tunnel barrier and the semiconductor is greater than 20%, or more preferably greater than 40%. The device may further include a second spintronic element that is in electronic communication with the first spintronic element, with the first and the second spintronic elements together forming respective devices for spin injection and spin detection.

One aspect of the invention is a method of using the aforementioned first spintronic element. The method includes flowing charge carriers between a surface of the semiconductor and the magnetic material, across the MgO tunnel barrier, in which the charge carriers undergo spin dependent tunneling through the MgO tunnel barrier. The method further includes detecting the spin polarization of the charge carriers. The charge carriers may include electrons or holes. The magnetic material may advantageously include a ferromagnetic material, and the semiconductor material may include GaAs.

Another aspect of the invention is a method of using the aforementioned first spintronic element, in which a voltage is applied across the device, so that a potential difference is established between the magnetic material and the semiconductor material, thereby inducing the flow of spin-polarized charge carriers between the magnetic material and the semiconductor material. The method may further include applying an electromagnetic field to change the direction of the spin of the charge carriers. The charge carriers may include electrons or holes. The magnetic material may advantageously include a ferromagnetic material, and the semiconductor material may include GaAs.

Yet another aspect of the invention is a method that includes forming a MgO tunnel barrier on a surface of an underlayer (in which the surface is selected to be substantially free of oxide), and forming an overlayer on the MgO tunnel barrier to construct a spintronic element, in which one of the underlayer and the overlayer includes a layer of semiconductor material, and the other of the underlayer and the overlayer includes a layer of magnetic material selected from the group consisting of ferromagnetic materials and ferrimagnetic materials; in the resulting spintronic element, a MgO tunnel barrier is sandwiched between the underlayer and the overlayer. In one preferred implementation, the MgO tunnel barrier is in direct contact with both the semiconductor material and the magnetic material. In another implementation, at least one of the underlayer and the overlayer includes a spacer layer that is in contact with the MgO tunnel barrier, in which the spacer layer is selected to not substantially interfere with the tunneling properties of the MgO tunnel barrier, thereby allowing charge carriers to substantially maintain their spin polarization as they pass through the spintronic element. The magnetic material may include a ferromagnetic material, and the spintronic element may further include a layer of antiferromagnetic material, in which the ferromagnetic material is exchange biased by the antiferromagnetic material. The method may further include annealing the spintronic element to increase the spin polarization of charge carriers passed through the element. The charge carriers may be electrons or holes. The MgO tunnel barrier may advantageously be substantially (100) oriented. Also, the magnetic material may include ferromagnetic material, with the ferromagnetic material being bcc and substantially (100) oriented.

A preferred method of forming the MgO tunnel barrier on the underlayer includes depositing Mg onto a surface of the underlayer to form a Mg layer thereon (in which the surface is selected to be substantially free of oxide). The preferred method further includes directing additional Mg, in the presence of oxygen, towards the Mg layer to form a MgO tunnel barrier in contact with the underlayer, in which the oxygen reacts with the additional Mg and the Mg layer. The thickness of the Mg layer is preferably selected to be large enough to prevent oxidation of the underlayer but small enough that, upon reaction of the oxygen with the Mg layer, substantially all the Mg in the Mg layer is converted into MgO; the Mg layer, however, is preferably deposited in the absence of substantial amounts of reactive oxygen. The resulting MgO tunnel barrier advantageously has a thickness of between 3 and 50 angstroms. The method preferably further includes annealing MgO tunnel barrier to improve its tunneling characteristics.

One embodiment of the invention is a device that comprises a first layer that includes at least one magnetic material from the group consisting of ferromagnetic materials and ferrimagnetic materials, with the first layer having a surface that is substantially free of oxide formed from the first layer (e.g., native oxide). The device further comprises a MgO tunnel barrier on and in contact with the surface of the first layer. The device also comprises a second layer that includes semiconductor material, with the second layer having a surface that is on and in contact with the MgO tunnel barrier, so that the MgO tunnel barrier is sandwiched between the first layer and the second layer. In a preferred embodiment, the surface of the overlayer is substantially free of oxide formed from the overlayer (e.g., native oxide). In another embodiment, at least one of the overlayer and the underlayer includes a spacer layer that is in contact with the MgO tunnel barrier, in which the spacer layer is selected to not substantially interfere with the tunneling properties of the MgO tunnel barrier. The MgO tunnel barrier preferably has a thickness of between 3 and 50 angstroms. In a preferred embodiment, i) the amount of any oxide separating the MgO tunnel barrier from the overlayer and the underlayer is sufficiently low, and ii) the MgO tunnel barrier, the underlayer, and the overlayer are sufficiently free of defects, that the spin polarization of current flowing between the MgO tunnel barrier and the semiconductor is greater than 20%, and more preferably greater than 40%.

Yet another embodiment of the invention is a preferred spintronic element that includes a magnetic layer of at least one ferromagnetic and/or ferrimagnetic material, a MgO tunnel barrier, and a semiconducting layer, in which the MgO tunnel barrier is between the magnetic layer and the semiconducting layer. The magnetic layer, the MgO tunnel barrier, and the semiconducting layer are in proximity with each other, so that, upon application of a voltage across the device, the spin polarization of current flowing between the MgO tunnel barrier and the semiconducting layer is greater than 20% (or more preferably greater than 40%). The magnetic layer is preferably a ferromagnetic material (such as Fe), bcc, and substantially (100) oriented. The MgO tunnel barrier is preferably also substantially (100) oriented and has a thickness of between 3 and 50 angstroms. The spintronic element may further include a layer of antiferromagnetic material, with the ferromagnetic material being exchange biased by the antiferromagnetic material. The semiconducting layer may advantageously include GaAs, or another semiconductor, such as $Al_xGa_{1-x}As$, $In_yGa_{1-y}As$, ZnSe, GaN, InGaN, GaNInAs, GaSb, InGaSb, InP, InGaP, Si, Ge, SiGe, and heterostructures thereof, in which x and y are between 0 and 100%. If a second spintronic element in electronic communication with the first spintronic element is used, the first and the second spintronic elements together may form respective devices for spin injection and spin detection.

A method of using the aforementioned preferred spintronic element includes flowing charge carriers between a surface of the semiconducting layer and the magnetic material (in which the charge carriers undergo spin dependent tunneling through the MgO tunnel barrier) and detecting the spin polarization of the charge carriers. The charge carriers may include electrons or holes. The magnetic material preferably includes ferromagnetic material, and the semiconducting layer may advantageously include GaAs.

Another method of using the aforementioned preferred spintronic element includes applying a voltage across it, so that a potential difference is established between the magnetic material and the semiconducting layer, thereby inducing the flow of spin-polarized charge carriers between the magnetic material and the semiconducting layer. The method may further include applying an electromagnetic field to change the direction of the spin of the charge carriers, which may include electrons or holes. The magnetic material preferably includes a ferromagnetic material, and the semiconducting layer may advantageously include GaAs.

For several aspects and embodiments of the invention disclosed herein, a MgO tunnel barrier is sandwiched between an underlayer and an overlayer, one of which includes one or more layers of a ferromagnetic material and/or a ferrimagnetic material, and the other of which includes a semiconductor. While the MgO tunnel barrier is preferably in direct contact with the ferromagnetic material, ferrimagnetic material and/or semiconductor, each of the underlayer and overlayer may optionally include one or more spacer layers which are adjacent to the MgO tunnel barrier but which do not significantly affect the tunneling properties of the MgO layer, e.g., by not significantly diminishing the spin polarization of electrons tunneling through the MgO tunnel barrier.

DESCRIPTION OF THE PREFERRED EMBODIMENTS

Theoretical calculations have predicted that tunneling structures based on crystalline MgO tunnel barriers can have much higher tunneling spin polarization compared to conventional tunneling structures based on amorphous $Al_2O_3$ tunnel barriers [Butler et al., Physical Review B 63, 054416 (2001); Mathon and Umerski, Physical Review B 63, 220403(R) (2001)]. However, prior art methods used to deposit MgO tunnel barriers have shown low tunneling spin polarization values most likely because of ferromagnetic oxides formed at the interface between the MgO tunnel barrier and the ferromagnetic layers. There have been several studies on the epitaxial growth of MgO onto GaAs substrates as buffer layers for the growth of superconducting or ferroelectric films. These prior art methods of forming MgO layers on GaAs include pulsed laser deposition, electron beam evaporation and magnetron sputtering of MgO layers directly onto GaAs or passivated GaAs surfaces. For example Bruley et al. [Appl. Phys. Lett. 65, 564 (1996)] use magnetron sputtering to deposit MgO layers onto (001) oriented GaAs but find that the quality of the MgO/GaAs interface is very poor. Cross-sectional high resolution transmission electron microscopy reveals that there is a 10-200 Å thick interface region between the MgO layer and the GaAs substrate which is amorphous and which contains both MgO as well as oxides of GaAs. Thus these prior art methods of forming MgO on GaAs are not practical for the realization of the high quality MgO/GaAs interfaces needed for spintronic applications, since they lead to loss of spin polarization of the injected electrons.

Figure 1A:
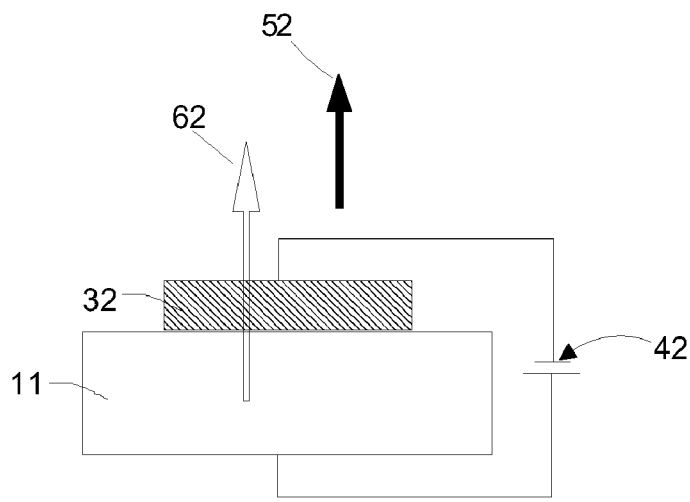
FIG. 1A shows a cross section of a prior art spin injector that uses an Fe/GaAs Schottky tunnel barrier injector, in which the electron spin polarization is measured by optical detection of the polarization of the light emitted from the semiconductor quantum well in a perpendicular magnetic field.
Figure 1B:
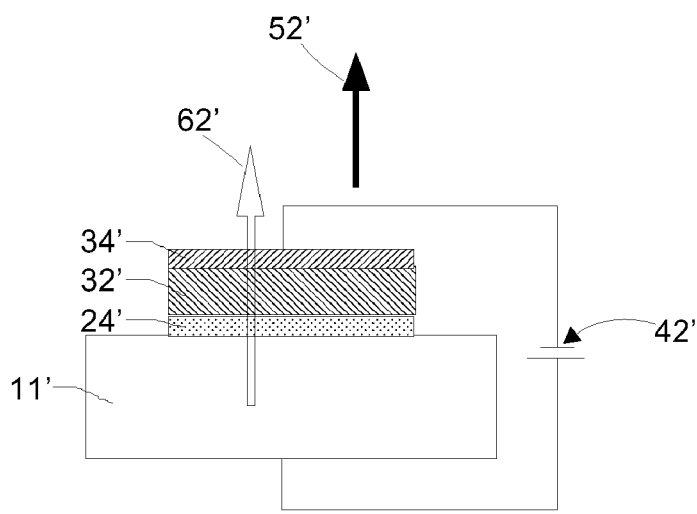
FIG. 1B shows a cross section of a prior art spin injector that uses a ferromagnetic metal/$Al_2O_3$ tunnel barrier injector, in which the electron spin polarization is measured by optical detection of the polarization of the light emitted from the semiconductor quantum well in a perpendicular magnetic field.
Figure 1C:
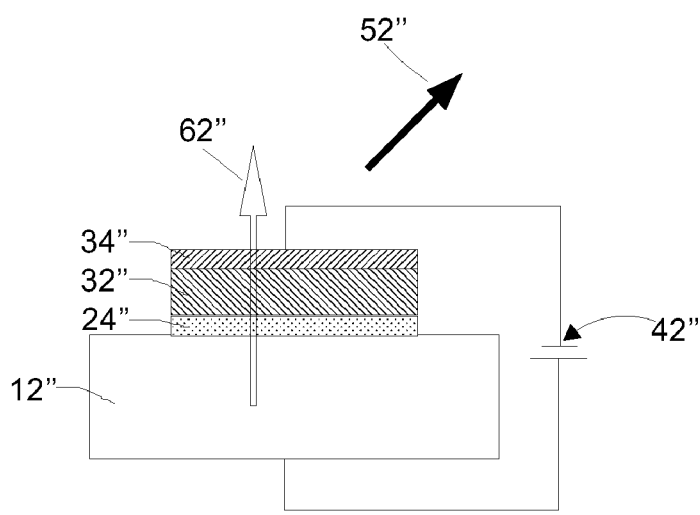
FIG. 1C shows a cross section of a prior art spin injector that uses a ferromagnetic metal/$Al_2O_3$ tunnel barrier injector, in which the electron spin polarization is measured using the Hanle effect in an oblique magnetic field.
Figure 2A:
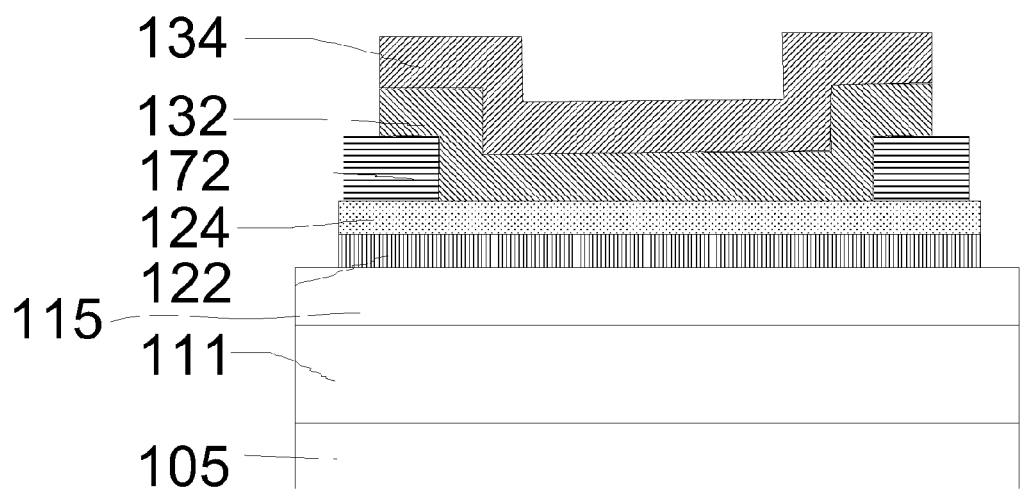
FIG. 2A illustrates the various layers that are deposited to form a spin injector device of the present invention, with the final structure being shown in FIG. 2B.
Figure 2B:
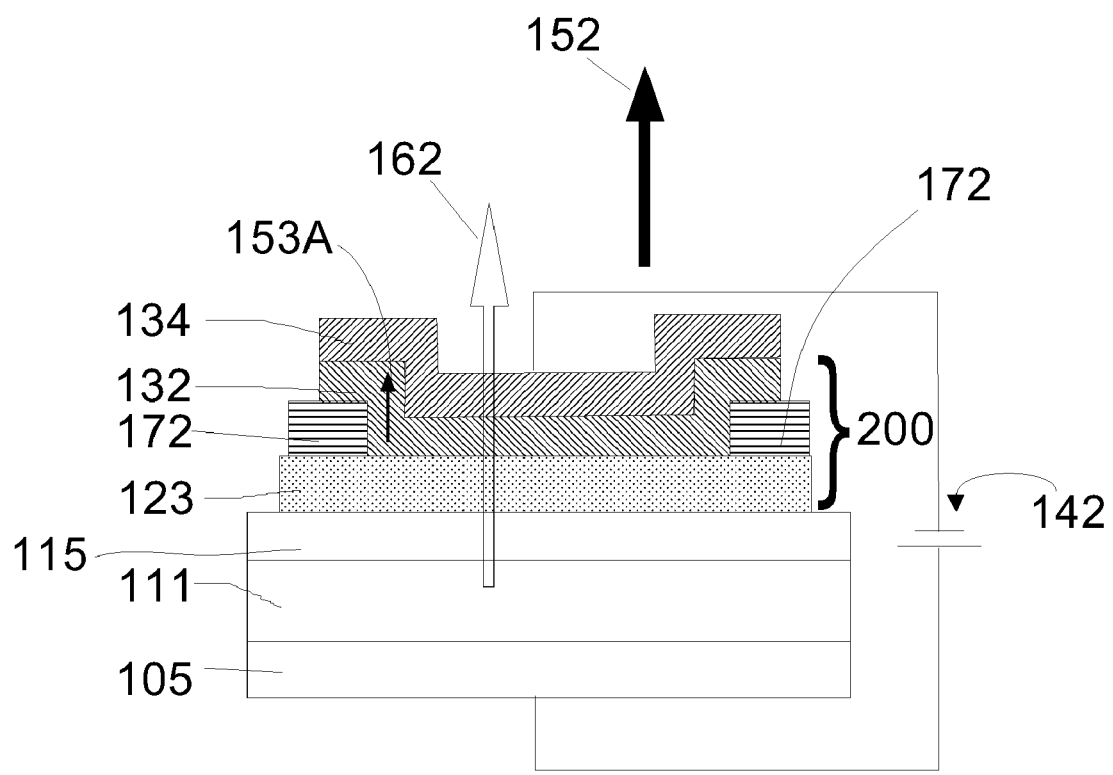
FIG. 2B shows a cross section of a spin injector that uses a $Co_{70}Fe_{30}$/MgO tunnel barrier injector, in which the electron spin polarization is measured by optical detection of the polarization of the light emitted from the semiconductor quantum well in a perpendicular magnetic field.

FIG. 2A shows the various layers that are deposited to form an exemplary spin injector device of the present invention. As discussed in more detail below, a MgO-based tunnel spin injector 200 is formed as a result of this process and is shown in FIG. 2B. The spin injector 200 is grown on a GaAs layer 115 which is crystallographically (100) oriented. The GaAs layer is grown on top of an AlGaAs/GaAs quantum well LED structure 111 which is itself grown on a p+-GaAs single crystalline (100) oriented substrate 105. The LED structure 111, which is not shown in detail, is incorporated here for the purposes of detecting and measuring the magnitude of the spin polarization of the injected current: The spin injector does not require the presence of the LED structure. The LED heterostructure 111 was grown in an MBE chamber and consists of the following layers grown on the p+-GaAs substrate 105: 200 nm Be doped p-GaAs ($1.1 \times 10^{19}$ cm$^{-3}$)/190 nm Be doped p-$Al_{0.08}Ga_{0.92}As$ ($1 \times 10^{19}$ cm$^{-3}$)/280 nm Be doped p-$Al_{0.08}Ga_{0.92}As$ ($2 \times 10^{18}$ cm$^{-3}$)/100 nm Be doped p-$Al_{0.08}Ga_{0.92}As$ ($1 \times 10^{17}$ cm$^{-3}$)/10 nm Be doped p-$Al_{0.08}Ga_{0.92}As$ ($1 \times 10^{15}$ cm$^{-3}$)/75 nm undoped $Al_{0.08}Ga_{0.92}As$/10 nm undoped GaAs/15 nm undoped $Al_{0.08}Ga_{0.92}As$/100 nm Si doped n-$Al_{0.08}Ga_{0.92}As$ ($5 \times 10^{16}$ cm$^{-3}$). The active region of the LED 111 is the 10 nm undoped GaAs quantum well sandwiched between the 75 nm undoped $Al_{0.08}Ga_{0.92}As$ layer and the 15 nm undoped $Al_{0.08}Ga_{0.92}As$ layer. The GaAs layer 115 is comprised of 5 nm undoped GaAs. Finally, the GaAs layer 115 is covered with a layer of arsenic (not shown) for the purpose of protecting this layer when it is exposed to air after the wafer is removed from the MBE chamber. The wafer is then transferred to a sputter deposition system for the purposes of forming the spin injector 200 by sputter deposition. The wafer is first heated at 550° C. for 15 minutes to remove the arsenic capping layer. After the sample cools down to room temperature, the spin injector structure 200 is grown.

All the layers of the spin injector were deposited at nominally room temperature, although the ambient temperature at the substrate position within the sputter deposition system is typically a little higher than room temperature because of the considerable energy injected into the magnetron plasma sources. Thus, the temperature at the substrates is likely in the range of 40 to 50° C.

The spin injector 200 is essentially comprised of a MgO tunnel barrier and a ferromagnetic layer, which are formed on top of the GaAs layer 115. Since the surface of the GaAs layer 115 is readily oxidized, the MgO tunnel barrier is formed by a method that prevents the oxidation of the GaAs surface layer but yet forms a high quality MgO tunnel barrier. (The other layers and components referred to herein may be constructed using techniques known to those skilled in the art.) For this purpose the MgO tunnel barrier is formed by first depositing a thin metallic Mg layer 122 (FIG. 2A) in the absence of any oxygen. The Mg layer 122 must be sufficiently thick to completely cover the GaAs layer 115 so as to prevent oxidation of the GaAs surface. The Mg layer preferably has a thickness of between 3 and 20 angstroms, more preferably between 3 and 10 angstroms, and still more preferably between 4 and 8 angstroms.

For the structure described here, a 1 nm thick Mg layer 122 (FIG. 2A) was deposited by dc magnetron sputtering in 3 mTorr argon on top of the GaAs layer 115. The MgO barrier is then formed by depositing a 3.1 nm thick MgO layer 124 (FIG. 2A) on the Mg layer 122 by reactive sputtering from a metallic Mg target in a gas mixture of 97% argon and 3% oxygen at 3 mTorr gas pressure. The ratio of argon and oxygen during the MgO deposition has been found to be important in obtaining a high-quality MgO barrier, although the optimized ratio depends on the particular sputtering system used for the deposition of the MgO layer 124. The quality of the MgO tunnel barrier can be judged in several ways. Perhaps the most straightforward is from the performance of the spin injector device 200 as determined from the magnitude of the spin polarization of the injected electrons (or holes). The oxygen content of the sputtering gas used during the deposition of the MgO layer can be varied so as to optimize the spin polarization of the tunneling current.

Although the MgO tunnel barrier is formed as a bilayer by first depositing a Mg layer 122 and then depositing a MgO layer 124 by depositing Mg in the presence of reactive oxygen (as shown in FIG. 2A), the Mg layer 122 is substantially all oxidized during the process of forming the layer 124, so that the bilayer behaves and structurally looks like a single substantially homogeneous layer 123 of MgO (as illustrated in FIG. 2B). The conditions of formation of the layer 124 are chosen so that this layer 124 is formed in the presence of a sufficient quantity of sufficiently reactive oxygen that the Mg layer 122 is oxidized during the deposition of layer 124. Although it is possible that the layer 122 is not completely oxidized, analysis by cross-section transmission electron microscopy does not readily distinguish, either by composition or texture, the two layers 122 and 124, which rather become a single layer 123 of MgO.

By using a (100) oriented GaAs substrate, the MgO layer 123, which is formed on top of the GaAs layer 115, is also textured in the (100) direction. In magnetic tunnel junction devices the largest tunneling magnetoresistance values are found for tunnel junction devices in which the MgO tunnel barrier is textured in the (100) orientation and the ferromagnetic layers adjacent to each side of the MgO tunnel barrier have a bcc crystal structure and are oriented in the (100) crystal orientation. Thus, to obtain the highest spin polarization of current from the spin injector device 200, the MgO tunnel barrier is preferably oriented in the (100) direction. The crystal structures of MgO and GaAs are well lattice matched, so that the crystal orientation of the MgO tunnel barrier follows that of the GaAs underlayer, so that the MgO tunnel barrier 123 is (100) oriented when it is deposited on a (100) oriented GaAs substrate 115.

The MgO layer 124 is formed by reactive sputtering from a metallic Mg target in an argon-oxygen gas mixture. The sputtering gas is predominantly formed from argon, with oxygen being in the range of 1.5 to 9% by volumetric flow of gas at standard temperature and pressure. Thus this corresponds to the relative molecular percentage of the components in the gas mixture. The oxygen partial pressure is kept sufficiently low to prevent "poisoning" of the metallic Mg sputtering target but is sufficient to form a fully oxidized MgO layer. Poisoning of the target can lead to irreproducible deposition, especially when the same target is used to form both the Mg layer 122 and the MgO layer 124. Conditioning of the target between depositing the Mg and MgO layers is very helpful in obtaining reproducible results. Conditioning may be carried out by pre-sputtering the target, either in argon prior to deposition of the Mg layer 122 or in argon-oxygen prior to deposition of the MgO layer 124. The optimum concentration of oxygen in the sputtering gas depends on the detailed geometry and size of the deposition chamber, the pumping speed of the vacuum pumps attached to the system, as well as the power applied to the Mg sputtering source. The deposition rate of the MgO will be influenced by the power applied to the Mg sputter gun, the oxygen concentration in the sputter gas, and the sputtering gas pressure, as well as geometric factors such as the distance from the sputter source to the substrate. Typically, it is preferred to use the smallest possible amount of oxygen not only to prevent contamination of the deposition chamber and other sputtering targets in the chamber, but also because the thermal stability of the MgO tunnel barrier is influenced by small amounts of excess oxygen in or on top of this layer.

The MgO layer 124 may be formed by various deposition methods in addition to reactive sputter deposition. Any method which delivers both Mg and oxygen in a sufficiently reactive state to form MgO during the deposition of the Mg and oxygen is suitable. For example, the Mg can be deposited by ion beam sputtering from a Mg target in the presence of oxygen generated from a source of atomic oxygen such as an rf or microwave source. Similarly, the MgO can be deposited by ion beam sputtering from a Mg target in the presence of reactive oxygen delivered from an ion-assist source. The MgO layer 124 can also be evaporated from a source of MgO, for example, by electron beam evaporation using a beam neutralizer, or by evaporation from a crucible or from a Knudsen source. The MgO layer 124 can also be formed by deposition from a MgO source in the presence of atomic oxygen provided by an rf or microwave source or any other source of sufficiently reactive oxygen. The MgO layer can also be formed by pulsed laser deposition either by using a MgO target or a Mg target in the presence of sufficiently reactive oxygen. The MgO layer may also be formed by reactive sputtering from a Mg target using various sputtering gas mixtures, provided that oxygen is present. For example, Argon can be replaced by other rare gases, for example, Neon or Krypton or Xenon. The Mg in the underlayer 122 and the MgO layer 124 are ideally free of impurities; the Mg preferably contains less than 5 atomic % of impurities, and more preferably less than 1 atomic % of impurities, so as to not substantially affect the tunneling properties of the MgO tunnel barrier, which would, for example affect the spin polarization of the injected current in a spin injector device.

For the purposes of the test structure described here, both the Mg layer 122 and the MgO layer 124 were deposited through a rectangularly (1×8 mm$^2$) shaped shadow mask. Next, a 50 nm thick $Al_2O_3$ isolation layer is grown in a gas mixture of 93% argon and 7% oxygen at 3 mTorr gas pressure through a second metal shadow mask. This layer covers regions of the MgO layer 123 to form pairs of circular isolation pads 172 with gaps between these pads ~300 μm wide. The pads 172 have diameters of ~2.5 mm. Finally, a ferromagnetic layer 132 formed from a 5 nm thick $Co_{70}Fe_{30}$ layer is deposited through a third shadow mask in the shape of a dogbone. This layer 132 is largely deposited on top of each pair of pads 172 formed from the isolation layer but also covers the small area of exposed MgO layer 123 between these pads. Thus this sequence of shadow masks creates small regions of ferromagnetic material 132 approximately 100× 300 μm$^2$ in size directly on top of the MgO tunnel barrier 123, which defines the active area of the tunnel injector. The isolation layer pads 172 are used to electrically isolate the ferromagnetic electrode 132 from the GaAs layer 115. The ferromagnetic electrode 132 is capped with a 10 nm thick Ta layer 134 to prevent oxidation. This capping layer 134 is deposited through the same shadow mask used to define the ferromagnetic layer 132. Both metal layers 132 and 134 are sputtered in 3 mTorr argon.

The use of shadow masks means that the edges of the MgO layer will be exposed to air. The humidity of the air may deleteriously affect the MgO layer, since MgO is hygroscopic and easily degrades in the presence of water to form a hydroxide which is much less stable. In actual devices the spin injector and the MgO are likely encapsulated by an oxide or other protective material.

The choice of the capping layer material may be determined by the effect of these structures on the magnetic properties of the underlying layer 132, or by the required thermal stability of the device; in this latter regard, TaN may be preferred for the capping layer 134. The layer 134 may also be comprised of various other metals, such as Cu, W, WTi, and TiN. The layer 132 may include one or more ferromagnetic or ferrimagnetic materials selected to give highly spin-polarized current through the MgO tunnel barrier 123.

The preferred thickness of the Mg layer 122 is in the range of 3 to 20 Å. The minimum thickness of the Mg layer 122 is determined by the amount of Mg required to completely cover the GaAs surface layer 115. This will depend, for example, on the roughness of the surface of the GaAs layer 115, the temperature at which the Mg layer 122 is deposited, and the energy of the deposited Mg atoms. Typically, the layer 122 will be smoother the lower the deposition temperature, so that nominally room temperature deposition is preferred. Lower temperature deposition may give rise to smoother layers but is less practical for manufacturing. The thickness of the MgO layer 122 can vary from ultra thin layers just a few angstroms thick to layers several tens of angstroms in thickness, but the preferred thickness will be determined by the device requirements for the resistance of the tunnel injector. The resistance of the injector increases inversely with the area of the active area of the tunnel injector, and the resistance also increases approximately exponentially with the thickness of the MgO layer 123. Thus for most device applications, the preferred thickness of the MgO layer 124 is in the range from 1 to 10 angstroms. The thickness of the resulting MgO layer 123 is preferably in the range of 3-50 angstroms, more preferably 3-30 angstroms, still more preferably 3-20 angstroms, and most preferably 4-15 angstroms.

Electrons are injected from the spin injector 200 into the semiconductor structure 115 by applying a bias voltage 142 across the entire structure in a perpendicular magnetic field whose orientation is given by the arrow 152. This magnetic field aligns the magnetic moment of the $Co_{70}Fe_{30}$ layer 132 to be perpendicular to the film plane, as indicated by the arrow 153A in FIG. 2B. The plane of the film is the plane defined, for example, by the interface between the MgO layer 123 and the CoFe layer 132. A perpendicular magnetic field 152 is required only for the purposes of optically detecting and measuring the spin polarization of the injected electrons with the QW LED detector 111. To operate the spin injector for the purpose of injecting a spin-polarized current into the GaAs layer 115, no magnetic field is necessarily required. A magnetic field can be applied to the spin injector 200 in order to magnetize the ferromagnetic layer 132 in a given direction either in the plane of the film (indicated by the arrow 153B in FIG. 7), or perpendicular to the film plane (indicated by the arrow 153A in FIG. 2B), or at some angle to the film plane. The spin polarization of the injected electrons will be aligned along the direction of the magnetization of the ferromagnetic layer 132, so by changing the direction of the magnetic moment of layer 132, the direction of the spin of the injected electrons can also be varied. The spin injector can be incorporated into a more complex microelectronic device in which a provision for magnetizing the layer 132 in different directions can be made. For example, this can be achieved by passing current or current pulses through micro-fabricated metal wires close to the spin injector 200. The direction of magnetization of the layer 132 can either be set in a given direction for the duration of the time during which the current is injected, or the remnant state of the magnetization of the ferromagnetic layer 132 can be changed, so that after the remnant state is set in a given direction, spin-polarized current can be injected from this ferromagnetic electrode.

The injected electrons recombine with holes in the quantum well LED 111 and emit light 162. The circular polarization of this electroluminescence (EL) signal is analyzed by a combination of a liquid crystal retarder and a linear polarizer to give the intensities of the left ($\sigma+$) and right ($\sigma-$) circular polarization components. The spectrum of the selected circular polarization component is recorded with a grating spectrometer and a charge-coupled device (not shown).

Figure 3:
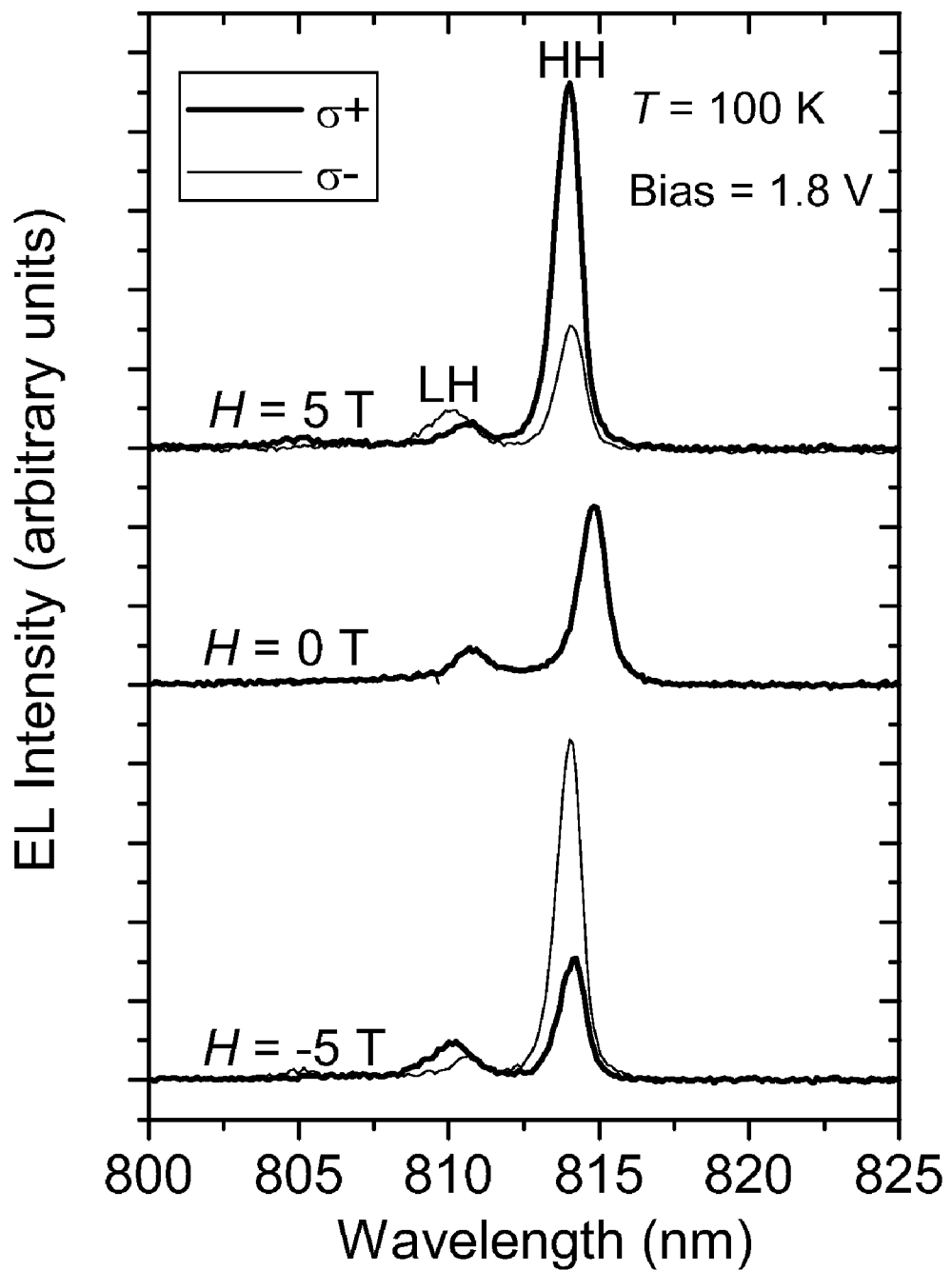
FIG. 3 shows electroluminescence spectra using a $Co_{70}Fe_{30}$/MgO tunnel spin injector at 100 K and with a bias voltage of 1.8 V, recorded for three different magnetic fields: 0 and ±5 T.

Shown in FIG. 3 is the EL spectrum of the device shown in FIG. 2B, at a temperature of 100 K and with a bias voltage of 1.8 V, for three different magnetic fields H=0 and ±5 T. The thick and thin lines represent the spectra of the $\sigma+$ and $\sigma-$ circular polarization components of the EL, respectively. There are two types of holes in the semiconductor quantum well: heavy holes (HH) and light holes (LH). The EL peaks at the longer and shorter wavelengths are due to electron recombination with the HH and LH, respectively. According to the optical selection rules, the circular polarization of HH emission is equal to the electron spin polarization just before the electrons recombine with the HH ["*Optical Orientation*", NorthHolland, Amsterdam, 1984, edited by Meier and Zakharchenya]. The heavy hole EL intensities of the $\sigma+$ ($I^+$) and $\sigma-$ ($I^-$) circular polarization components are coincident in the absence of a magnetic field, because the magnetic moment in the $Co_{70}Fe_{30}$ layer 132 is aligned parallel to the plane of the QW structure 111, whereas the light 162 is emitted in a direction perpendicular to this plane. The plane of the QW device is parallel to the plane formed by the CoFe layer 132 and the MgO layer 123. Applying a large field H=±5 T (whose orientation is given by the arrow 152) brings the moment of the $Co_{70}Fe_{30}$ layer 132 parallel to the direction of propagation of the emitted light 162 (as shown in FIG. 2B), so that significant heavy hole EL polarization is now observed. The sign of the light polarization depends on the direction of the magnetic moment of the $Co_{70}Fe_{30}$ layer 132 and so changes when the magnetic field direction is reversed. The heavy hole EL polarization $P_{EL}$, defined as $P_{EL}=(I^+-I^-)/(I^++I^-)$, reaches ~50% at 5 T.

Figure 4:
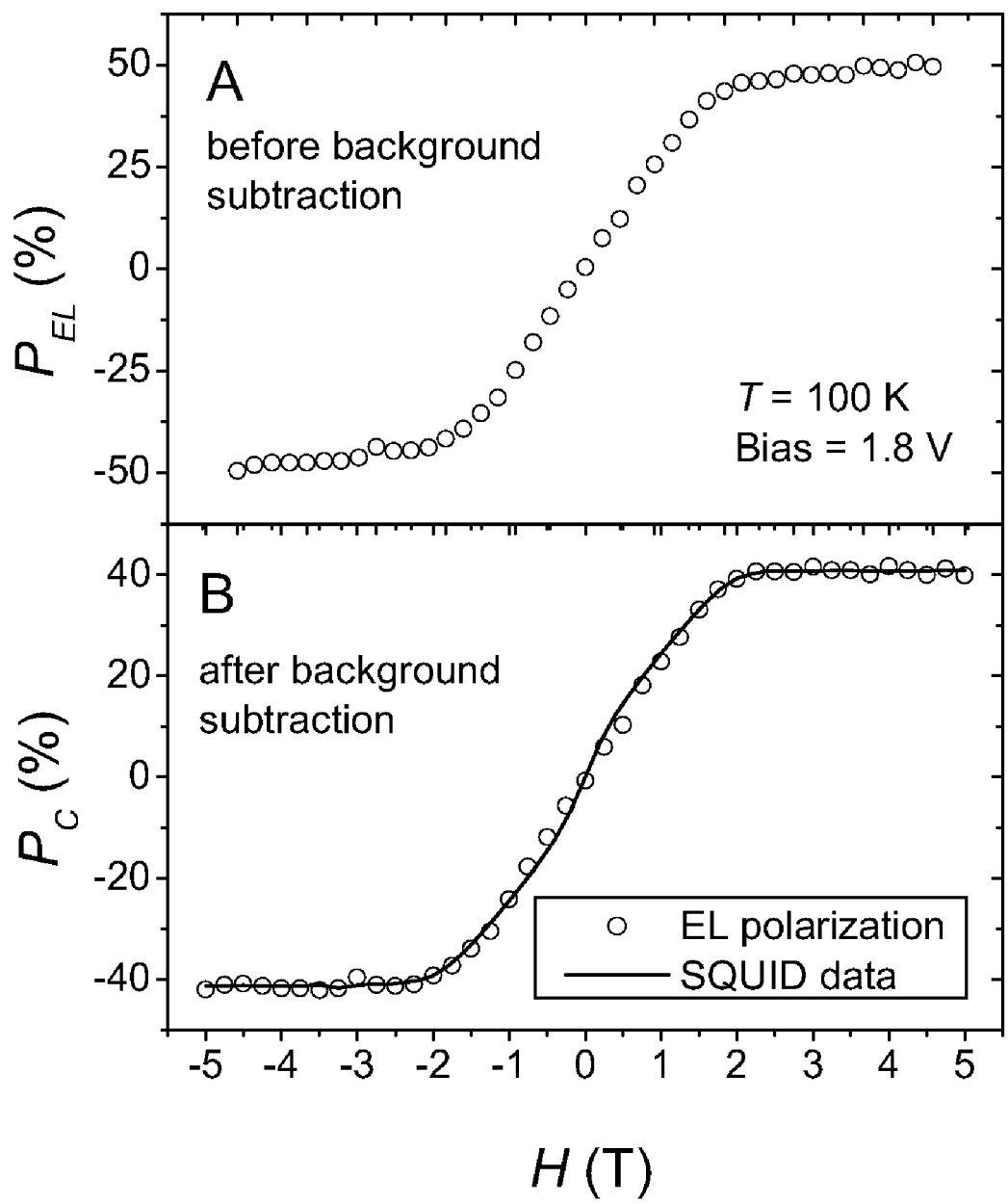
FIG. 4A shows the electroluminescence polarization before background subtraction (open circles) as a function of magnetic field, using a $Co_{70}Fe_{30}$/MgO tunnel spin injector at 100 K and with a bias voltage of 1.8 V.
FIG. 4B shows the electroluminescence polarization after background subtraction (open circles) as a function of magnetic field, using a $Co_{70}Fe_{30}$/MgO tunnel spin injector at 100 K and with a bias voltage of 1.8 V, in which the perpendicular magnetic moment of the $Co_{70}Fe_{30}$ layer (solid line) was measured with a superconducting quantum interference device magnetometer at 20 K.

FIG. 4A shows $P_{EL}$ as a function of the magnetic field H applied perpendicular to the plane of the ferromagnetic electrode 132. $P_{EL}$ increases rapidly with increasing H as the magnetic moment of the $Co_{70}Fe_{30}$ layer 132 is rotated out of plane by the magnetic field 152. At fields above ~2 T, when the $Co_{70}Fe_{30}$ magnetic moment is rotated completely out of the plane, $P_{EL}$ continues to increase with H but at a much slower rate. $P_{EL}$ increases approximately linearly at a rate of ~1.7%/T. A polarization of ~50% is obtained at 5 T. The linear increase of $P_{EL}$ with the magnetic field (referred to as the linear "background" polarization, hereafter) is due to the suppression of spin relaxation by the perpendicular magnetic field. Electrons injected into the semiconductor 115 can lose their initial spin polarization through spin relaxation processes before they recombine with the holes. One of the most important spin relaxation mechanisms in GaAs-based semiconductor heterostructures is the D'yakonov-Perel' (DP) mechanism, which is due to spin precession about an effective magnetic field whose magnitude and direction depend on the electron momentum [D'yakonov and Kachorovskii, Soviet Physics-Semiconductors 20, 110 (1986)]. It is well known that a perpendicular magnetic field can suppress the DP spin relaxation ["*Optical Orientation*", NorthHolland, Amsterdam, 1984, edited by Meier and Zakharchenya]. Therefore, the spin relaxation is reduced at larger perpendicular magnetic fields and a higher spin polarization is measured.

FIG. 4B shows the dependence of spin polarization $P_C$ on perpendicular magnetic field (see FIG. 2B) after subtraction of the linear background polarization, such that $P_C=P_{EL}-1.7\%/T \times H$. $P_C$ is shown as open circles in FIG. 4B. A polarization of ~42% is obtained for magnetic fields larger than ~2 T. The solid line in FIG. 4B corresponds to the component of the magnetization of the $Co_{70}Fe_{30}$ layer 132 measured perpendicularly to its plane at 20 K as a function of a perpendicular magnetic field. These data were measured with a superconducting quantum interference device (SQUID) magnetometer. Although $P_C$ is measured at 100K and the SQUID magnetization data are measured at 20K, there is a very weak temperature dependence of magnetization of the $Co_{70}Fe_{30}$ layer 132 in this temperature regime. The excellent agreement between the EL data and the SQUID data confirms that the spin polarization inside the semiconductor structure 111 is indeed due to spin injection from the $Co_{70}Fe_{30}$ layer 132.

The $Al_{0.08}Ga_{0.92}As$/GaAs quantum well in the semiconductor LED 111 has a very low light emitting efficiency for temperatures above 100 K due to the small confinement potential of the $Al_{0.08}Ga_{0.92}As$ layers. Consequently, the spin injection experiments are limited by the optical detection efficiency to temperatures no higher than ~100 K. However, ferromagnetic metals normally have very high Curie temperatures (>1000 K) and thus can maintain their spin polarization at room temperature. Meanwhile, the tunneling process only has a weak temperature dependence. Therefore, the very high spin injection efficiency observed at 100 K will remain high up to room temperature.

Figure 5:
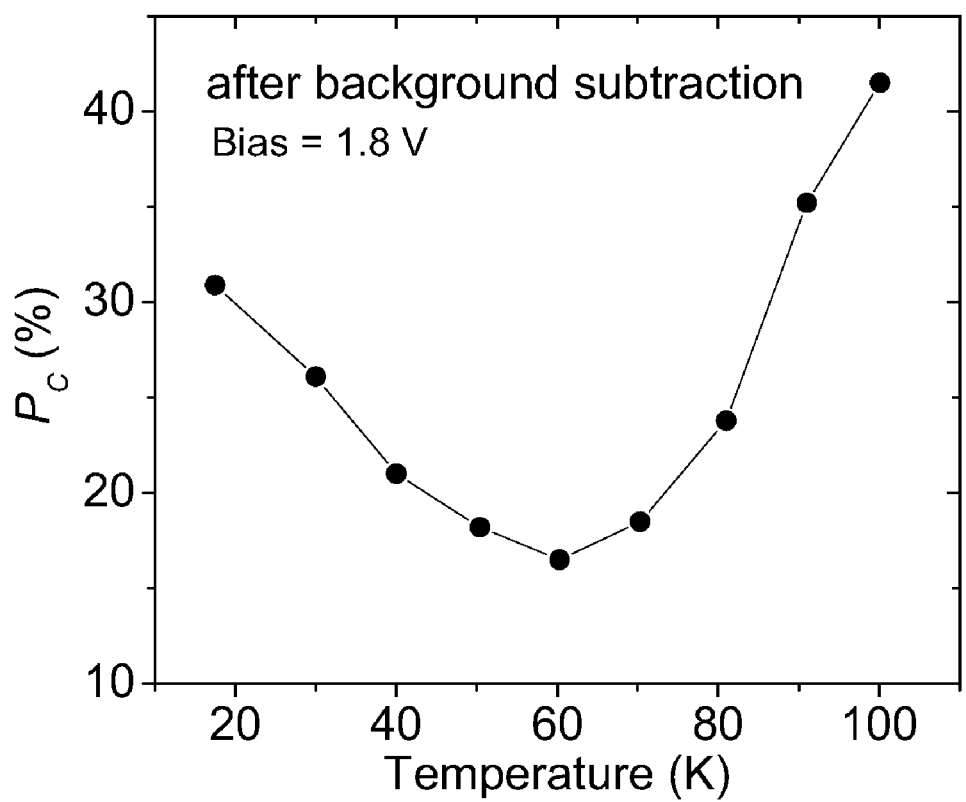
FIG. 5 shows the electroluminescence polarization after background subtraction (solid circles) as a function of temperature, using a $Co_{70}Fe_{30}$/MgO tunnel spin injector with a bias voltage of 1.8 V.

Shown in FIG. 5 is $P_C$ as a function of temperature at a bias voltage of 1.8 V for the device shown in FIG. 2B. A dramatic non-monotonic temperature dependence is observed, which is again most likely associated with the DP spin relaxation mechanism, as described in a recent theoretical paper by Puller et al. [Physical Review B 67, 155309 (2003)]. DP spin relaxation is due to spin precession about an effective magnetic field whose magnitude and direction depends on the electron momentum. Electron momentum scattering tends to randomize the effective magnetic field direction and thus reduce the averaging effect of this magnetic field. Enhanced momentum scattering therefore suppresses DP spin relaxation. The momentum scattering rate in GaAs has a minimum for temperatures in the range ~40-60 K, as reported by Wolfe et al. in Journal of Applied Physics 41, 3088 (1970). Consequently, the DP spin relaxation is more efficient at ~60 K, giving rise to a minimum in the spin polarization at this temperature as observed in FIG. 5. The temperature dependence of $P_C$ is thus a strong signature of DP spin relaxation in the QW. Other spin relaxation mechanisms could not account for the observed temperature dependence. Model calculations based on the DP mechanism indicate that the observed temperature dependence of $P_C$ can be well accounted for by DP spin relaxation within the quantum well itself and that, therefore, the temperature dependence of the spin injection efficiency is actually quite weak over the temperature range from 4 to 100 K. Indeed, there may well be some spin relaxation in the GaAs layers before the electrons enter the QW, so that $P_C$ sets a lower bound for the spin injection efficiency. In particular, over the temperature range from 4 to 100 K these experiments indicate that the spin polarization of the injected electrons is more than 50% which is very high.

Figure 6:
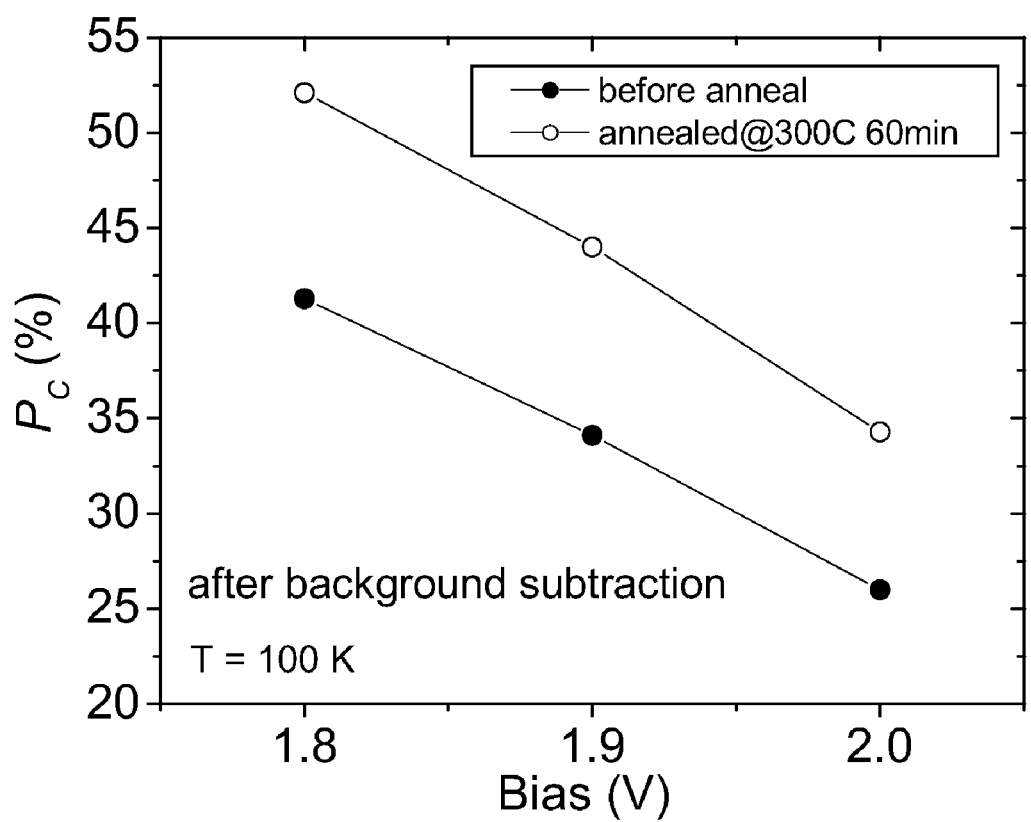
FIG. 6 shows the electroluminescence polarization after background subtraction as a function of the bias voltage, using a $Co_{70}Fe_{30}$/MgO tunnel spin injector at 100 K, in which the solid and open circles represent results for the sample before and after annealing at 300° C. for 60 minutes, respectively.

The solid circles in FIG. 6 correspond to $P_C$ measured as a function of the bias voltage at 100 K. The decrease of $P_C$ with the bias voltage can be attributed to DP spin relaxation processes. The magnitude of the effective magnetic field in the DP relaxation process depends on the electron momentum. The larger electron momentum at higher biases leads to a larger effective magnetic field, which results in more efficient spin relaxation before the electrons recombine with the heavy holes. This consequently leads to a smaller detected spin polarization.

Higher voltages across the MgO tunnel barrier 123 lead to greater current injection into the semiconductor 115. The current increases non-linearly with the voltage across the MgO barrier layer 123 because of the non-linear characteristics of the MgO tunnel injector and the QW LED 111. The maximum voltage which can be applied to the device is limited by the breakdown voltage of the MgO tunnel barrier 123. In FIG. 6 the voltage 142 corresponds to the voltage drop across the MgO tunnel barrier 123 plus the voltage drop across the QW LED detector 111. The breakdown voltage of the MgO tunnel barrier is about 1 volt per 1 nm thickness of the MgO layer 123.

Studies of the thermal stability of the spin injector 200 were carried out. Thermal anneal treatments improve the magnitude of the measured spin polarization of the spin injector device. Data comparing the bias voltage dependence of $P_C$ before (solid circles) and after an anneal treatment at 300° C. for 60 minutes in a high vacuum annealing furnace (open circles) are shown in FIG. 6. As shown in the figure, the polarization of the electroluminescence, which is the spin polarization of the injected electrons, is substantially increased after the anneal treatment at 300° C. For a bias voltage of 1.8 V the polarization is increased from 42% to 52% at a measurement temperature of 100 K. Even higher polarizations can be realized after higher temperature anneals. After the anneal, the sample is cooled in vacuum in the annealing furnace to ~50° C. before being exposed to air. Thermal anneal treatments most likely improve the interface between the $Co_{70}Fe_{30}$ layer 132 and the MgO barrier 123 and therefore result in a higher tunneling spin polarization and thus a higher spin injection efficiency. Thermal anneal treatments may also improve the MgO tunnel barrier 123 by, for example, improving the degree of oxidation of the Mg layer 122, perhaps through redistribution of oxygen from the layer 124 to the layer 122. Moreover, this result also indicates that the separation of the ferromagnetic metal layer 132 and the semiconductor structure 115 by the MgO tunnel barrier 123 prevents intermixing of the two and gives rise to thermally stable structures. Thermal annealing may also improve the crystallographic texture of the MgO layer 123 and the surrounding layers, so that the structure of the MgO layer 123 prior to annealing may not be substantially (100) oriented, but after thermal anneal treatments in the temperature range described above the crystallographic texture becomes substantially (100) oriented. The improvement of the MgO tunnel barrier on annealing can be monitored from the spin polarization of the current injected into the semiconductor.

The methods of forming the MgO tunnel barriers described herein provide tunnel barriers which are largely free of defects, which might otherwise impede the tunneling of charge carriers across the barrier. For example, defects in the barrier may provide electronic states in the barrier into which charge carriers may hop and reside for sufficient periods of time that they lose their spin polarization or spin memory. Similarly, these methods provide an interface between the MgO tunnel barrier and the underlayer which is largely free of oxide formed from the underlayer, which would otherwise degrade the performance of the spin injector, in contrast to prior art methods of forming MgO tunnel barriers.

Although the layers comprising the spin injector 200 were deposited at nominally room temperature, the preferred deposition temperatures will depend on the detailed structure and composition of these layers.

Although the data shown in FIGS. 3 through 6 were obtained using $Co_{70}Fe_{30}$ as the ferromagnetic electrode 132, other ferromagnetic metals can also be used as the ferromagnetic electrode, such as Co, Fe, Ni and their binary and ternary alloys. In magnetic tunnel junctions (MTJs) with MgO tunnel barriers (formed using the methodology disclosed herein), very large tunneling magnetoresistance (TMR) values exceeding 100% at room temperature are found for MTJs in which the ferromagnetic electrodes are formed from Fe or $Co_{100-x}Fe_x$ alloys with the bcc crystal structure, and in which these alloys are textured with their (100) crystal axis perpendicular to the plane of the ferromagnetic and MgO layers; similarly, very large values of the spin polarization of current tunneling from Fe or $Co_{100-x}Fe_x$ alloys through MgO tunnel barriers are found using superconducting tunneling spectroscopy (STS). Thus, for the spin injector 200 of the current application, the preferred ferromagnetic metals for the layer 132 which give the highest values of spin-polarized current are bcc alloys of Fe, Co—Fe and Ni—Fe and, more particularly, Fe and $Co_{100-x}Fe_x$ alloys with x in the range from 8 to 50 atomic percent, and the preferred crystallographic orientation of these layers is (100). The thermal stability of the MgO/CoFe interface is greatest for Co—Fe alloys with Fe content in the range of 12 to 25 atomic %. The thermal stability of this interface can be as high as 400° C. depending particularly on the composition of the Co—Fe alloy and the amount of oxygen used in fabricating the MgO layer 124. Using the preferred ferromagnetic metals, the spin polarization of the injected current using the spin injector of the current application can exceed 76%, which is considerably higher than is possible using prior art spin injectors based on ferromagnetic metals. Even when the ferromagnetic layer is not formed from the preferred ferromagnetic metals, the spin injector of FIG. 2B nevertheless still shows high spin polarization in the range of 50% spin-polarized current, which is also much higher than has previously been obtained using prior art ferromagnetic metal spin injectors.

Ferromagnetic half-metals such as $Fe_3O_4$, $CrO_2$, the Heusler and half Heusler alloys such as NiMnSb and PtMnSb can also be used as the ferromagnetic layer 132.

The ferromagnetic layer 132 can also be formed from more than one ferromagnetic layer in order to provide an improved spin injector. For example, it may be preferred to form the interface layer in direct contact with the MgO tunnel barrier 123 from an Fe layer or a Co—Fe alloy in order to obtain the highest possible spin polarization. The spin polarization is strongly dependent on the interface between the MgO layer 123 and the ferromagnetic layer 132. However, in order to reduce the magnetostatic stray fields from the edges of layer 132, which become larger as the lateral dimensions of the layer 132 are decreased, it may be preferred to reduce the magnetic moment of the layer 132, either by minimizing its thickness or preferably by forming the bulk of layer 132 from a low magnetization magnetic material such as NiFe or a CoNiFe alloy or by forming low magnetization alloys by alloying Ni, Co and Fe and their binary and ternary alloys with non-magnetic elements.

It may also be preferred to form the ferromagnetic electrode 132 from a sandwich of two antiferromagnetically coupled ferromagnetic layers for the purposes of reducing the stray magnetostatic fields from the edges of the ferromagnetic electrode. As described in U.S. Pat. No. 5,465,185 to Parkin and Heim and U.S. Pat. No. 6,153,320 to Parkin, this can be accomplished by forming the electrode 132 from a sandwich of two thin ferromagnetic layers separated by a thin layer of Ru or Os or an alloy of Ru and Os.

Figure 7:
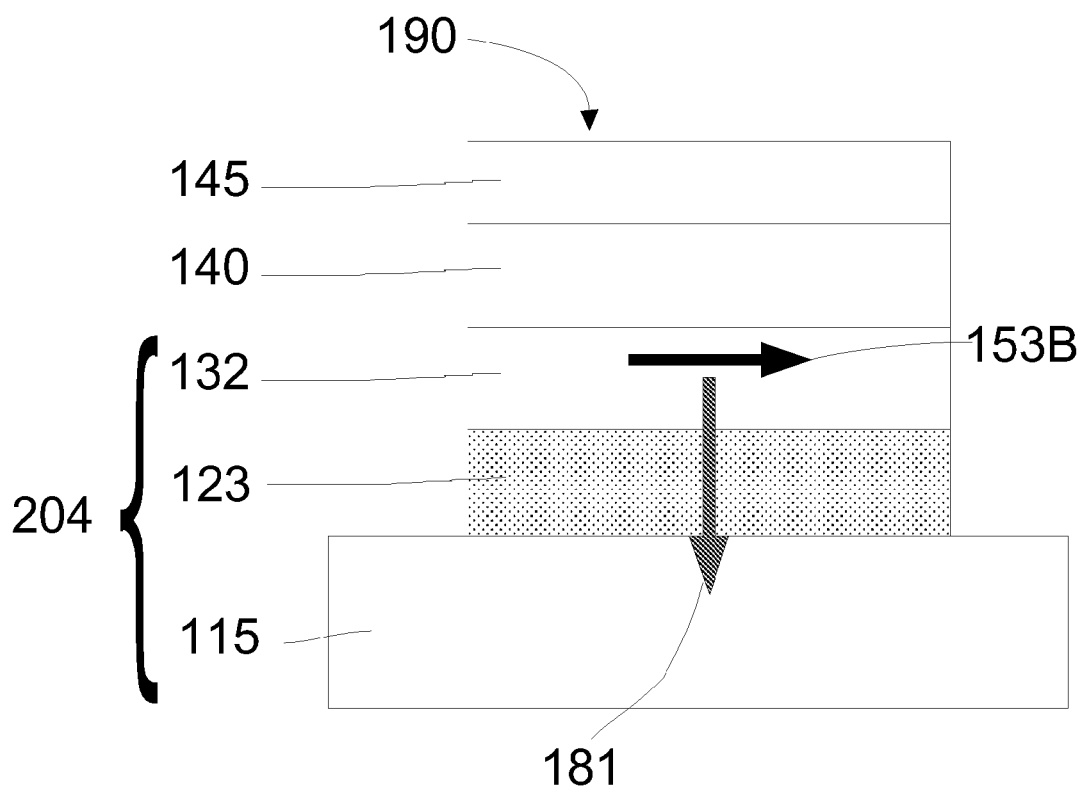
FIG. 7 shows a cross section of a spin injector including an exchange biased ferromagnetic layer.

The essential components of the spin injector 200 are the MgO tunnel barrier 123 (formed by depositing an Mg layer 122 and the MgO layer 124) and the ferromagnetic electrode 132, as illustrated in FIG. 7 (as well as FIG. 2B). The spin injector 200 and the semiconducting layer 115 together form a spintronic element 204. It may be preferred to fix the direction of the magnetic moment of layer 132 in a particular direction, such as is illustrated by the direction of the arrow 153B in FIG. 7. This direction can be in the plane of the ferromagnetic layer 132 as indicated by the arrow 153B, or it can be perpendicular to the plane as indicated by the arrow 153A in FIG. 2B. The magnetic moment of the ferromagnetic layer 132 can be fixed in a particular direction by using magnetic shape anisotropy by forming the ferromagnetic electrode in a shape that is generally longer in one direction than in another direction. The magnetic moment will prefer to be oriented along the longer direction, because the magnetostatic energy of the device is minimized for this orientation of the ferromagnetic moment. As illustrated in FIG. 7, the magnetic moment direction of layer 132 can also be fixed by using the exchange bias field provided by an antiferromagnetic layer 140 in direct contact with layer 132. The antiferromagnetic layer can be formed from various antiferromagnetic metals including Ir—Mn and Pt—Mn alloys. The antiferromagnetic layer can be covered with a capping layer 145 to prevent corrosion of the layer 140 and also for the purpose for forming a contact to the spin injector device 190. The capping layer 145 can be formed from TaN, Ta, Ru, Cu and other metals.

The magnetic moment of the ferromagnetic layer 132 can also be pinned or fixed in a particular direction by forming the ferromagnetic layer from a magnetically hard magnetic material such as an alloy of Co and Fe with Pt or Cr.

Figure 9:
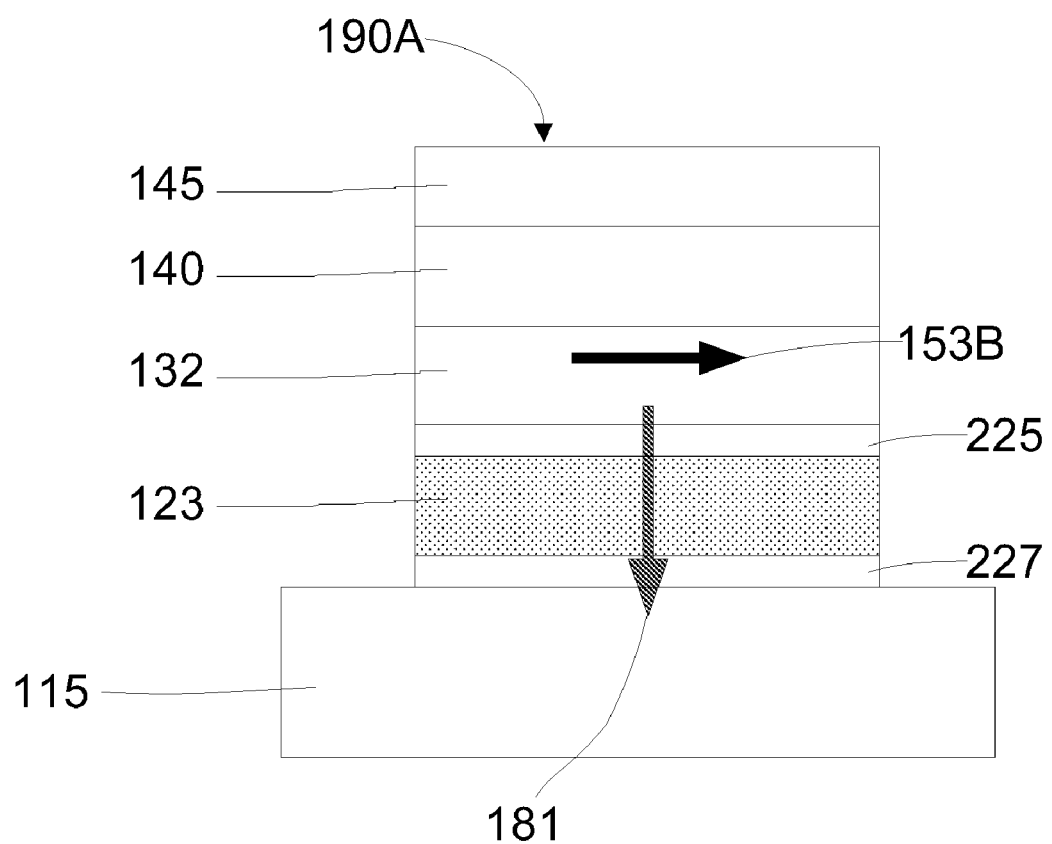
FIG. 9 shows a cross section of a spin injector that includes spacer layers adjacent to the MgO tunnel barrier.

While the ferromagnetic layer is preferred to be in direct contact with the MgO tunnel barrier 123, it is also possible to separate the ferromagnetic electrode 132 and the tunnel barrier 123 by a thin spacer layer, providing that the spacer layer does not significantly diminish the spin polarization of the electrons injected from the ferromagnetic layer 132 into the semiconductor layer 115 through the tunnel barrier 123. A spin injector device 190a of this type is illustrated in FIG. 9 where the spacer layer is shown as layer 225. As described in U.S. Pat. No. 5,764,567 to Parkin with reference to magnetic tunnel junction devices formed with alumina tunnel barriers, the ferromagnetic electrodes in such MTJs can be separated from the tunnel barrier by one or more thin spacer layers 225 formed from Cu and other non-magnetic metallic materials while maintaining significant tunneling magnetoresistance. Likewise, the tunnel barrier 123 may be separated from the semiconductor layer 115 by a spacer layer 227. The types of non-magnetic metallic materials which are preferred are those which display large values of giant magnetoresistance in metallic spin-valve structures or in metallic magnetic multilayers. These include Ag and Au as well as Cu.

In the embodiments shown herein, the semiconductor LED 111 serves as an optical detector of the spin injection efficiency, but is not essential for the spin injection process. The semiconducting layer 115 can be comprised of a wide range of semiconductors in addition to GaAs, including the families of GaAs related semiconductors, $Al_{1-x}Ga_xAs$ (in which x can be varied between 0 and 100%) and $In_yGa_{1-y}As$ (in which y can be varied between 0 and 100%), the family of II-VI semiconductors such as ZnSe, nitrides including GaN, InGaN and GaNInAs, antimonides including GaSb and InGaSb, phosphides including InP and InGaP, and Si and related compounds including Ge and SiGe, and heterostructures of these compounds.

While the spin injector, which includes the ferromagnetic layer 132 and the MgO tunnel barrier 123, is shown attached to the surface of the semiconducting layer 115 in FIGS. 2B and 7-9, the spin injector can also be attached to the side or edge of a semiconducting structure or heterostructure.

The spin injector device 190 shown in FIG. 7 is a source of spin-polarized electrons and is operated by applying a voltage across the device (by attaching electrical leads between the top of the device and the semiconductor substrate) so that electrons (or holes) flow from the ferromagnetic layer 132 across the tunnel barrier 123 into the semiconducting layer 115. (Note that electrical current, by convention, flows in the direction opposite to that of the flow of electrons.) There may be non-magnetic spacer layers 225 and 227 on one or both sides of the MgO tunnel barrier 123 as shown in FIG. 9. The direction of the flow of electrons is indicated by the direction of the arrow 181 (the electrical current flows in the opposite direction). The spin injector may be one component of a semiconducting spintronic device. Within the semiconducting part of the device, which may be comprised of a multiplicity of semiconducting materials, the direction of the spin of the flowing electrons may be changed by the application of electric or magnetic fields. The magnetic fields may be provided by various means including creating an Oersted field by passing current through neighboring electrical wires or regions of the device. Alternatively, magnetic fields can be created by creating magnetic domain walls in magnetic wires or other magnetic structures, as described in Applicant's copending, commonly owned application titled "System and Method for Writing to a Magnetic Shift Register" to S. S. P. Parkin, filed on Jun. 10, 2003 (application Ser. No. 10/458, 147), which is hereby incorporated by reference in its entirety. Alternatively, magnetic fields can be created from the demagnetizing fields emanating from the edges or sides of patterned magnetic nano-elements or from inhomogenous magnetization in magnetic nano-elements or wires. Electric fields may also be used to modulate the spin-polarization of the injected spin-polarized electrons through spin-orbit interactions and may be applied by applying voltage to electrical contacts or gates situated on or close to the spintronic device.

Figure 8:
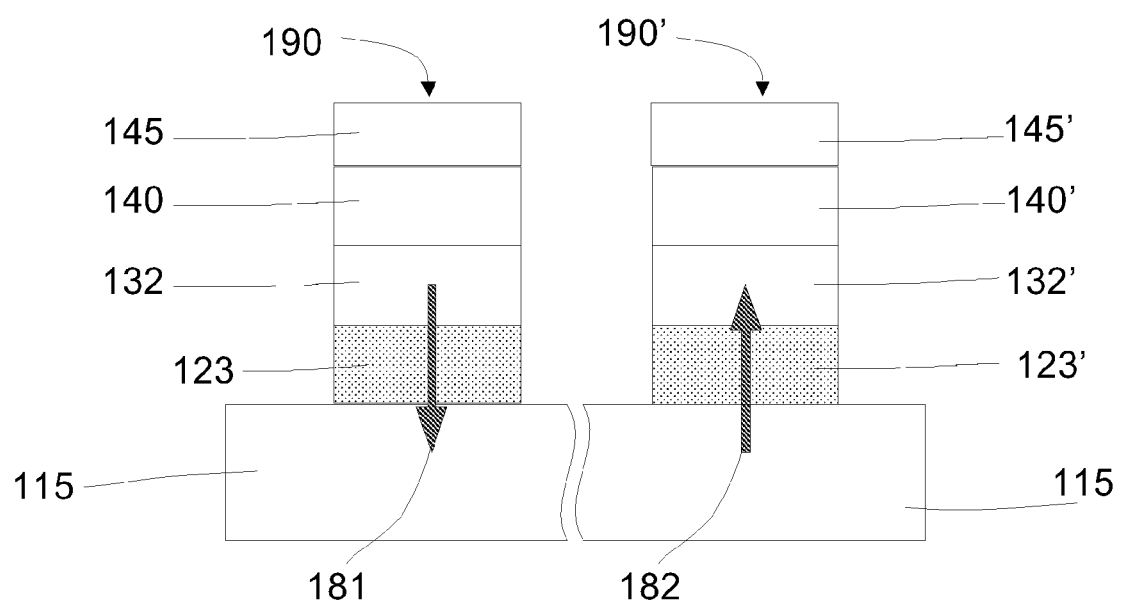
FIG. 8 shows a cross section of a spintronic device that utilizes both a spin injector and a spin detector.

A device of the same or similar structure to that of the spin injector can also be used as a detector or analyzer of spin-polarized electrons (or holes) by flowing these electrons (or holes) from the surface of the semiconducting layer 115 through the MgO tunnel barrier 123 into the ferromagnetic detection layer 132 as illustrated in FIG. 8 by the device 190' and by the direction of the flow of electrons given by arrow 182; the primed numerals in FIG. 8 (including 140' and 145') designate components that are like their unprimed counterparts.

The conductance of the device 190' depends on the orientation of the spin polarization of the electrons with respect to that of the magnetic moment of the ferromagnetic layer 132' at the interface with the MgO layer 123'. The conductance will be greater if there are available empty electronic states in the ferromagnetic 132' with the same spin polarization as that of the tunneling electrons. This is a manifestation of spin-dependent tunneling effect.

For useful spintronic devices, the spin injector must provide current which is sufficiently spin-polarized on entry into the semiconducting portion of the device that the inevitable loss of spin polarization as the charge carriers are manipulated within this portion of the device does not prevent the manipulation and subsequent detection of the spin polarization of the charged carriers. Thus, the spin injector preferably injects a current which is more than 20% spin polarized in the semiconductor, more preferably more than 30% and still more preferably greater than 40%, and still more preferably greater than 50% spin polarized. This is readily accomplished with the MgO tunnel spin injector of this invention.

In 1990 Datta and Das [Applied Physics Letters 56, 665 (1990)] proposed a spintronic device comprised of two metallic ferromagnetic electrodes connected to a two dimensional electron gas within a GaAs based heterostructure. The ferromagnetic electrodes are used as spin injectors and spin analyzers. Between the two ferromagnetic electrodes a gate contact is used to apply an electric field so as to cause the spin of electrons injected from one contact to precess, because of spin-orbit coupling, during their motion from the first to the second ferromagnetic contact. This device has not yet been successfully fabricated because, as yet, there has been no successful demonstration of significant spin injection from a metallic ferromagnetic contact into a semiconductor. The spin injector 190 and detector 190' of the current invention based on ferromagnetic layers 132 and 132' in contact with MgO tunnel barriers 123 and 123' in contact with a semiconductor 115 enable construction of the Datta-Das spintronic device.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method, comprising:
forming a MgO tunnel barrier on a surface of an underlayer;
forming an overlayer on the MgO tunnel barrier to construct a spintronic element, with one of the underlayer and the overlayer including a layer of semiconductor material, and the other one of the underlayer and the overlayer including a layer of magnetic material selected from the group consisting of ferromagnetic materials and ferrimagnetic materials; and
annealing the MgO tunnel barrier at a temperature selected to improve tunneling characteristics of the MgO tunnel barrier, wherein
i) the MgO tunnel barrier is sandwiched between the underlayer and the overlayer, and ii) the underlayer, the MgO tunnel barrier, and the overlayer are configured to enable spin-polarized charge carrier transport between the layer of semiconductor material and the layer of magnetic material,
said forming a MgO tunnel barrier including:
depositing Mg onto the surface of the underlayer to form a Mg layer thereon; and
directing additional Mg, in the presence of oxygen, towards the Mg layer to form a MgO tunnel barrier in contact with the underlayer, the oxygen reacting with the additional Mg and the Mg layer.

2. The method of claim 1, wherein the thickness of the Mg layer is selected to be large enough to prevent oxidation of the underlayer but small enough that, upon reaction of the oxygen with the Mg layer, substantially all the Mg in the Mg layer is convened into MgO.

3. The method of claim 1, wherein the Mg layer is deposited in the absence of substantial amounts of reactive oxygen.

4. The method of claim 1, wherein the MgO tunnel barrier has a thickness of between 3 and 50 angstroms.

5. The method of claim 1, wherein the MgO tunnel barrier and the layer of semiconductor material are formed so that they are lattice-matched, and each of the MgO tunnel barrier and the layer of semiconductor material is crystalline.

6. The method of claim 1, wherein the semiconductor material includes GaAs, the MgO tunnel barrier is substantially (100) oriented, and the magnetic material includes ferromagnetic material that is bcc and substantially (100) oriented.

7. The method of claim 1, wherein the semiconductor material includes Si.

8. The method of claim 1, wherein upon application of a voltage across the spintronic element, the spin polarization of charge carriers flowing between the MgO tunnel barrier and the layer of semiconductor material is greater than 20%.

9. The method of claim 1, wherein upon application of a voltage across the spintronic element, the spin polarization of charge carriers flowing between the MgO tunnel barrier and the layer of semiconductor material is greater than 40%.

10. The method of claim 1, wherein upon application of a voltage across the spintronic element, the spin polarization of charge carriers flowing between the MgO tunnel barrier and the layer of semiconductor material is greater than 50%.

11. The method of claim 1, wherein the annealing temperature is at least 300° C.

12. The method of claim 1, wherein the annealing step includes annealing the MgO tunnel barrier at a temperature of at least 300° C. for 60 minutes.

13. The method of claim 1, wherein the magnetic material includes ferromagnetic material.

14. The method of claim 13, wherein the ferromagnetic material includes an alloy of Co and Fe.

15. The method of claim 1, further comprising:
forming a first lead that is in electrical communication with the semiconductor material; and
forming a second lead that is in electrical communication with the magnetic material, thereby enabling at least one of the following: the flowing of spin-polarized charge carriers into the spintronic element, and the flowing of spin-polarized charge carriers out of the spintronic element.

16. The method of claim 1, further comprising:
forming a second spintronic element, the second spintronic element being in electronic communication with the spintronic element of claim 1, the spintronic elements together forming respective devices for spin injection and spin detection.

17. The method of claim 1, wherein the semiconductor material is selected from the group consisting of $Al_xGa_{1-x}As$, $In_yGa_{1-y}As$, ZnSe, GaN, InGaN, GaNInAs, GaSb, InGaSb, InP, InGaP, Si, Ge, SiGe, and heterostructures thereof, in which x and y are between 0 and 1.

18. The method of claim 1, comprising annealing the spintronic element to increase the spin polarization of charge carriers passed through the element.

19. The method of claim 1, wherein each of the MgO tunnel barrier and the layer of semiconductor material is crystalline.

20. The method of claim 19, wherein upon application of a voltage across the spintronic element, the spin polarization of charge carriers flowing between the MgO tunnel barrier and the layer of semiconductor material is greater than 20%.

21. The method of claim 20, wherein the semiconductor material includes GaAs.

22. The method of claim 20, wherein the semiconductor material includes Si.

23. The method of claim 20, wherein the MgO tunnel barrier is substantially (100) oriented, and the magnetic material includes ferromagnetic material that is bcc and substantially (100) oriented.

24. The method of claim 20, wherein the MgO tunnel barrier is in direct contact with both the layer of semiconductor material and the layer of magnetic material.

25. The method of claim 20, further comprising:
forming a first lead that is in electrical communication with the semiconductor material; and
forming a second lead that is in electrical communication with the magnetic material, thereby enabling at least one of the following: the flowing of spin-polarized charge carriers into the spintronic element, and the flowing of spin-polarized charge carriers out of the spintronic element.

* * * * *